United States Patent
Ghosh et al.

(10) Patent No.: US 9,443,913 B2
(45) Date of Patent: Sep. 13, 2016

(54) METHOD OF TUNING DISPLAY CHROMATICITY BY MIXING COLOR FILTER MATERIALS AND DEVICE HAVING MIXED COLOR FILTER MATERIALS

(75) Inventors: Amalkumar P. Ghosh, Beacon, NY (US); Scott Ziesmer, Poughkeepsie, NY (US); Ilyas Khayrullin, Flanders, NJ (US)

(73) Assignee: eMagin Corporation, Hopewell Junction, NY (US)

( * ) Notice: Subject to any disclaimer, the term of this patent is extended or adjusted under 35 U.S.C. 154(b) by 351 days.

(21) Appl. No.: 13/169,862

(22) Filed: Jun. 27, 2011

(65) Prior Publication Data

US 2011/0316413 A1 Dec. 29, 2011

Related U.S. Application Data

(60) Provisional application No. 61/358,510, filed on Jun. 25, 2010.

(51) Int. Cl.
*H01J 9/00* (2006.01)
*H01L 27/32* (2006.01)
*H01L 51/52* (2006.01)

(52) U.S. Cl.
CPC ......... *H01L 27/322* (2013.01); *H01L 51/5284* (2013.01)

(58) Field of Classification Search
CPC .................. H01L 27/322; H01L 51/5284
USPC .................................... 313/498–500
See application file for complete search history.

(56) References Cited

U.S. PATENT DOCUMENTS

2010/0085452 A1* 4/2010 Hirakawa et al. ............ 348/273
2011/0228200 A1* 9/2011 Tsai et al. ..................... 349/106

\* cited by examiner

*Primary Examiner* — Joseph L Williams
(74) *Attorney, Agent, or Firm* — Kaplan Breyer Schwarz & Ottesen, LLP; Janine D. Geraigery, Esq.

(57) ABSTRACT

A color display is provided that includes a light emitting sub-pixel and a filter layer including first and second color filter materials. The first color filter material is adapted to reduce transmittance of visible light outside a first transmittance spectrum corresponding to a first color, and the second color filter material is adapted to reduce transmittance of visible light outside a second transmittance spectrum corresponding to a second color. The second color is different than the first color. A color display having a white-balanced pixel is provided. A method of white-balancing a light emitting device is provided. A method of reducing unwanted light output due to electrical leakage is provided to fall below a pre-determined threshold. An opaque layer may be interposed between the sub-pixels and/or may frame illuminated areas of sub-pixels, and may be a combination of red, green, and/or a blue filter material.

11 Claims, 7 Drawing Sheets

| Color Filter Mixture | 1931 CIE-x | | | | 1931 CIE-y | | | |
| --- | --- | --- | --- | --- | --- | --- | --- | --- |
| | RGB | R | G | B | RGB | R | G | B |
| 100% Green | 0.305 | 0.563 | 0.282 | 0.167 | 0.387 | 0.350 | 0.536 | 0.168 |
| 94% Green / 6% Red | 0.338 | 0.586 | 0.310 | 0.181 | 0.354 | 0.344 | 0.505 | 0.167 |

FIGURE 2A

| Color Filter Mixture | L (cd/m²) | | | |
| --- | --- | --- | --- | --- |
| | RGB | R | G | B |
| 100% Green | 224 | 42 | 157 | 30 |
| 94% Green / 6% Red | 167 | 42 | 102 | 26 |

FIGURE 2B

METHOD OF TUNING DISPLAY CHROMATICITY BY MIXING COLOR FILTER MATERIALS AND DEVICE HAVING MIXED COLOR FILTER MATERIALS

CROSS-REFERENCE TO RELATED APPLICATIONS

This application claims the benefit of U.S. Provisional Application No. 61/358,510 filed Jun. 25, 2010, which is incorporated herein by reference.

STATEMENT REGARDING FEDERALLY SPONSORED RESEARCH OR DEVELOPMENT

Not Applicable

BACKGROUND OF THE INVENTION

1. Field of the Invention

The present invention relates to light emitting devices. In particular, the present invention relates to a filter design for organic light emitting diode ("OLED") devices.

2. Description of the Related Art

An OLED device typically includes a stack of thin layers formed on a substrate. In the stack, a light-emitting layer of a luminescent organic solid, as well as adjacent semiconductor layers, is sandwiched between a cathode and an anode. The light-emitting layer may be selected from any of a multitude of fluorescent organic solids. Any of the layers, and particularly the light-emitting layer, may consist of multiple sub layers.

In a typical OLED, either the cathode or the anode is transparent. The films may be formed by evaporation, spin casting, other appropriate polymer film-forming techniques, or chemical self-assembly. Thicknesses typically range from a few monolayers to about 1 to 2,000 angstroms. Protection of OLED against oxygen and moisture can be achieved by encapsulation of the device. The encapsulation can be obtained by means of a single thin-film layer situated on the substrate, surrounding the OLED.

Currently, OLED display technology utilizes two general approaches to deliver color images. The first approach is a color display where three entirely different OLED stacks reside on three adjacent individually driven sub-pixels to produce red, green, and blue (RGB) color emissions due to distinct configuration of organic layers within the individually designed stacks. This approach is appropriate for large size displays, but has certain difficulties in being implemented in color displays where pixel and sub-pixel dimensions are on the scale of micrometers.

The second approach is a color display where white emission from a common OLED stack is filtered through three single color filter layers residing on three adjacent sub-pixels to produce red, green and blue colors (alternatively referred to herein as RGB colors). This second approach can be comfortably used for both large and small dimension OLED displays.

In the color filter white OLED display of the second approach, each individual filter layer is put on top of a sub-pixel using photolithography technique and possesses distinct function. A red color filter layer transmits only a red portion of a white OLED emission and cutting out or reducing below a level of human perceptibility visible light in the other portions of the visible light spectrum. A green color filter layer transmits only a green portion of a white emission. A blue color filter layer transmits only a blue portion of white emission, preventing red and green emissions from contributing to the image. Thus the chromaticity of such a display using a white OLED stack and three single color filters on three RGB sub-pixels largely depends on the filter layer's ability to transmit or stop certain portions of the white emission in the visible optical band.

Two factors play major role in the transmissivity of color filter material. First, the chemical and physical compositions of the layer are significant, and second, the thickness of the layer is also significant. The layer thickness is important from a display color saturation standpoint, in that the thicker the color filter layer is, the better the performance of the filter layer. However, it is not always possible to attain the desired thickness of a color filter layer due to the limitations in photolithography techniques, spin coating processes, and the properties of the color filter material. It may not be possible to achieve a desired transmittance simply by reducing or increasing a thickness of a layer due to the limits on varying a thickness of a spin coated film.

Color balancing a display requires that the relative transmittance of the three sub-pixels in an RGB display have comparable transmittances. In particular, the combination of the light emitted from an RGB display with all three sub-pixels on should be close to a standard white color, for instance point D65 on a 1931 CIE color coordinate graph.

One of the three color filter materials, for instance a green color filter material, may have a higher transmittance than the other two color filter materials, thereby shifting a white balance for the OLED, or other light emitting device, display. A green filter layer blocks red and blue light. If the green filter has a higher transmittance, then the green light will be stronger, causing green shifting when mixing colors for white, RG (red-green) or BG (blue-green).

High resolution active matrix displays may include millions of pixels and sub-pixels that are individually addressed by the drive electronics. Each sub-pixel can have several semiconductor transistors and other IC components. Each OLED may correspond to a pixel or a sub-pixel, and these terms are used interchangeably herein.

Another problem in balancing OLED display colors may arise when the separation between two adjacent pixels or sub-pixels are being reduced to the micrometer or sub-micrometer dimensions. The smaller the separation is between sub-pixels, the larger the probability of an electrical leakage current between adjacent sub-pixels. The smaller the size of the sub-pixels, the higher the density of the electronic circuit elements in the backplane. A variety of technologies are used to fabricate OLED display backplanes including but not limited to single crystal silicon and poly-silicon wafers, glass backplanes with layers of transparent conducting films, and flexible organic or inorganic backplanes.

One common obstacle for all the above mentioned technologies is the possibility of increased leakage current with increasing density and decreasing circuit elements size, irrespective of the OLED stack. While leakage current may be very low and random, on the order of nano- or even pica-Amperes, it may still affect performance of an OLED display. For example, even if all green sub-pixels are turned off, and only red sub-pixels are turned on, the leakage current through green sub-pixels may skew the otherwise pure red color emission produced by the red sub-pixels.

Another type of leakage is an optical leakage of light between RGB sub-pixels. One solution to this problem is to implement a black matrix layer, which is an opaque material placed between sub-pixels.

A passive material that operates as a filter has a transmittance spectrum, an absorbance spectrum and a reflectance spectrum. If light is generated within the material, for instance an emissive layer in an OLED, then the material has an emissive spectrum.

BRIEF SUMMARY OF THE INVENTION

The present invention describes method of controlling and fine tuning display chromaticity by using a mixture of at least two color filter materials in a single layer or in combination with other color filters layers deposited on top of or between individual color sub-pixels.

The present innovation provides a solution to green shifting when mixing colors for white, RG (red-green) or BG (blue-green) by adding a small amount of red or blue filter material to a green filter to block some of the green light (i.e., reduce the strength of the transmitted green light) to prevent a green-weighted transmission for all light including some green (e.g., white, RG, or BG).

The present innovation may depend on the white light spectrum of the emissive layer of the OLED or other light emitting device, and also depends on the filter efficiency for each of the three colors in the pixel array. The present innovation can be used to tune one or two of the three filters to achieve an improved white balance.

The present innovation may provide a reduction in the strength of a particular color light emission to thereby reduce or eliminate the effect of electrical leakage.

The present innovation may provide an opaque layer using a mix of three filter materials to form a visible light barrier between pixels to prevent optical leakage. The opaque layer using a mix of the three green filters may also be used as a framing material to surround the active areas of the color sub-pixels of a three-color pixel to prevent optical leakage and/or to improve performance.

A color display is provided that includes a light emitting sub-pixel having a base electrode, a transparent electrode, and a light-emissive layer interposed between the base electrode and the transparent electrode. The color display also includes a filter layer arranged so that the transparent electrode is interposed between the filter layer and the emissive layer. The filter layer includes first and second color filter materials, and the first color filter material is adapted to reduce transmittance of visible light outside a first transmittance spectrum corresponding to a first color, and the second color filter material is adapted to reduce transmittance of visible light outside a second transmittance spectrum corresponding to a second color. The second color is different than the first color.

The filter layer may include a first color filter sub-layer including the first color filter material and a second color filter sub-layer including the second color filter material. The filter layer may include a mixture of the first color filter material and the second color filter material.

A color display having a white-balanced pixel is provided that includes at least three light emitting sub-pixels, each sub-pixel having a base electrode, a transparent electrode, and a light-emissive layer interposed between the base electrode and the transparent electrode. The color display also includes a filter layer for one of the light emitting sub-pixels arranged so that the transparent electrode is interposed between the filter layer and the emissive layer of the respective light emitting sub-pixel. The filter layer includes first and second color filter materials, and the first color filter material is adapted to reduce transmittance of visible light outside a first transmittance spectrum corresponding to a first color, and the second color filter material is adapted to reduce transmittance of visible light outside a second transmittance spectrum corresponding to a second color. The second color is different than the first color.

The at least three light emitting sub-pixels may include a red sub-pixel, a green sub-pixel and a blue sub-pixel. The filter layer may include a green filter material and a blue filter material and/or a red filter material. A proportion of the green filter material to the blue filter material and/or the red filter material in the green filter layer are selected to improve a white balance of the display compared to a further display having a further filter layer including only the green filter material.

A white light emission from the display may be closer to point D65 on a 1931 CIE color chart than a further white light emission from the further display having the further filter layer including only the green filter material.

A method of white-balancing a light emitting device having a plurality of sub-pixels having color filters is provided. The method includes providing a red sub-pixel, a green sub-pixel and a blue sub-pixel, each sub-pixel having a base electrode, a transparent electrode, and a light-emissive layer interposed between the base electrode and the transparent electrode. The method also includes providing a filter layer for each sub-pixel arranged so that the transparent electrode is interposed between the filter layer and the emissive layer of the respective sub-pixel. A filter layer for the green sub-pixel includes a green filter material and a blue filter material and/or a red filter material. The method further includes selecting a proportion of the green filter material to the blue filter material and/or the red filter material in the green filter layer to improve a white balance of the display compared to a further display having a further green filter layer including only the green filter material.

A method of reducing unwanted light output due to electrical leakage in a light emitting device having a plurality of sub-pixels having color filters is provided. The method includes providing a color filter for at least one of the sub-pixels having at least first and second color filter materials. The first color filter material is adapted to reduce transmittance of visible light outside a first transmittance spectrum corresponding to a first color, and the second color filter material is adapted to reduce transmittance of visible light outside a second transmittance spectrum corresponding to a second color. The second color is different than the first color, and the color filter has a transmittance causing a luminosity due to electrical leakage into the at least one sub-pixel to fall below a pre-determined threshold.

The predetermined threshold may be a lower limit of human perception, calculated on an average basis or any other appropriate statistical method. The pre-determined threshold may be determined based on an average human perception.

An apparatus for emitting light is provided that includes two light emitting sub-pixels, each sub-pixel having a base electrode, a transparent electrode, and an emissive layer interposed between the base electrode and the transparent electrode. The apparatus also includes an opaque layer that is a combination of at least two of a red filter material, a green filter material, and a blue filter material. The opaque layer is interposed between the sub-pixels.

The opaque layer may be a combination of red filter material, a green filter material, and a blue filter material.

A method of reducing unwanted light output due to optical cross-talk in a light emitting device having at least two sub-pixels having color filters is provided. The method includes providing an opaque layer interposed between two of the sub-pixels. The opaque layer is a combination of at least two of a red filter material, a green filter material, and a blue filter material.

An apparatus for emitting light is provided that includes a light emitting sub-pixel having a base electrode, a transparent electrode, and an emissive layer interposed between the base electrode and the transparent electrode. The apparatus also includes an opaque layer that is a combination of at least two of a red filter material, a green filter material, and a blue filter material. The opaque layer is arranged so that the transparent electrode is interposed between the opaque layer and the emissive layer. The opaque layer is provided in at least part of a region surrounding a selectively illuminated active area of the apparatus.

A method of reducing unwanted light output due to spurious reflection from a region surrounding a selectively illuminated active area of a light emitting device is provided. The light emitting device has at least one sub-pixel having a color filter. The sub-pixel has a base electrode, a transparent electrode, and an emissive layer interposed between the base electrode and the transparent electrode. The method includes selectively illuminating the active area of the light emitting device, and providing an opaque layer arranged so that the transparent electrode is interposed between the opaque layer and the emissive layer. The opaque layer is provided in at least part of the surrounding region surrounding the selectively illuminated active area. The opaque layer is a combination of at least two of a red filter material, a green filter material, and a blue filter material.

These objects and the details of the invention will be apparent from the following description and accompanying drawings.

BRIEF DESCRIPTION OF THE DRAWINGS

FIG. 2A is a table of red, green, blue and combined color coordinates for a pure green filter and an exemplary green filter layer in accordance with an exemplary embodiment;

FIG. 2B is a table of red, green, blue and combined luminosities for a pure green filter and an exemplary green filter layer in accordance with an exemplary embodiment;

DETAILED DESCRIPTION OF THE INVENTION

The present invention proposes to use mixtures of at least two or more color filter materials in one layer, or in combination with individual color filter layers. The layer or layers will be deposited on at least one sub-pixel within a group of three RGB sub-pixels to subdue parasitic contribution of emission due to electrical current leakage from an inactive sub-pixel.

The present invention proposes to use mixtures of at least two or more color filter materials in one layer, or in combination with individual color filter layers which will be deposited on at least one sub-pixel within a group of three RGB sub-pixels or between the sub-pixels. The present invention proposes to use mixtures of at least two or more color filter materials to construct a single opaque layer that can be placed on desired locations on OLED display to block undesired emission across entire visible optical band.

Figure 1A:
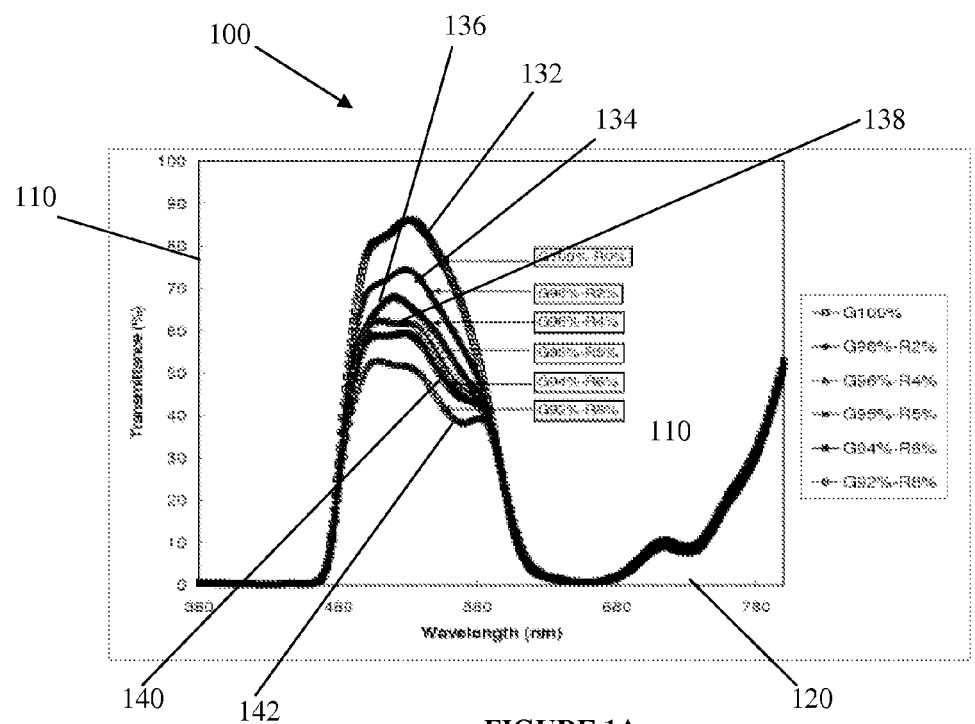
FIG. 1A is a graph of transmittance with respect to wavelength for exemplary green filter layers in accordance with an exemplary embodiment.

FIG. 1A is graph 100 of transmittance with respect to wavelength for exemplary green filter layers in accordance with an exemplary embodiment. FIG. 1A shows the transmittance spectra of color filter films that are spin coated on a glass substrate from mixtures containing green and red filter materials in the indicated proportions. Specifically, FIG. 1A shows transmittance spectra of a thin film spin coated from a mixture of a green (G) filter material and red (R) filter material. X-axis 120 shows wavelength of the emitted light, and extends from 380 nm (nanometers) to approximately 800 nm. Y-axis 110 shows the transmittance percentage, and extends from 0 percent to 100 percent. Curve 132 shows the transmittance with respect to wavelength of a pure green filter, having only green filter material and no red filter material. Curve 134 shows the transmittance with respect to wavelength of a modified green filter, having 98 percent green filter material and 2 percent red filter material. Curve 136 shows the transmittance with respect to wavelength of a modified green filter, having 96 percent green filter material and 4 percent red filter material. Curve 138 shows the transmittance with respect to wavelength of a modified green filter, having 95 percent green filter material and 5 percent red filter material. Curve 140 shows the transmittance with respect to wavelength of a modified green filter, having 94 percent green filter material and 6 percent red filter material. Curve 142 shows the transmittance with respect to wavelength of a modified green filter, having 92 percent green filter material and 8 percent red filter material.

Depending on the proportion between two individual filter materials, transmittance spectra can be fine-tuned to attain any desired transmittance between about 50% and 90% without changing thickness of the layer. Such tuning capability is achieved by utilizing a red filter material having a non-transmissive spectrum portion between about 480 nm and 600 nm, which is spectrum where a green filter material is most transparent.

Figure 1B:
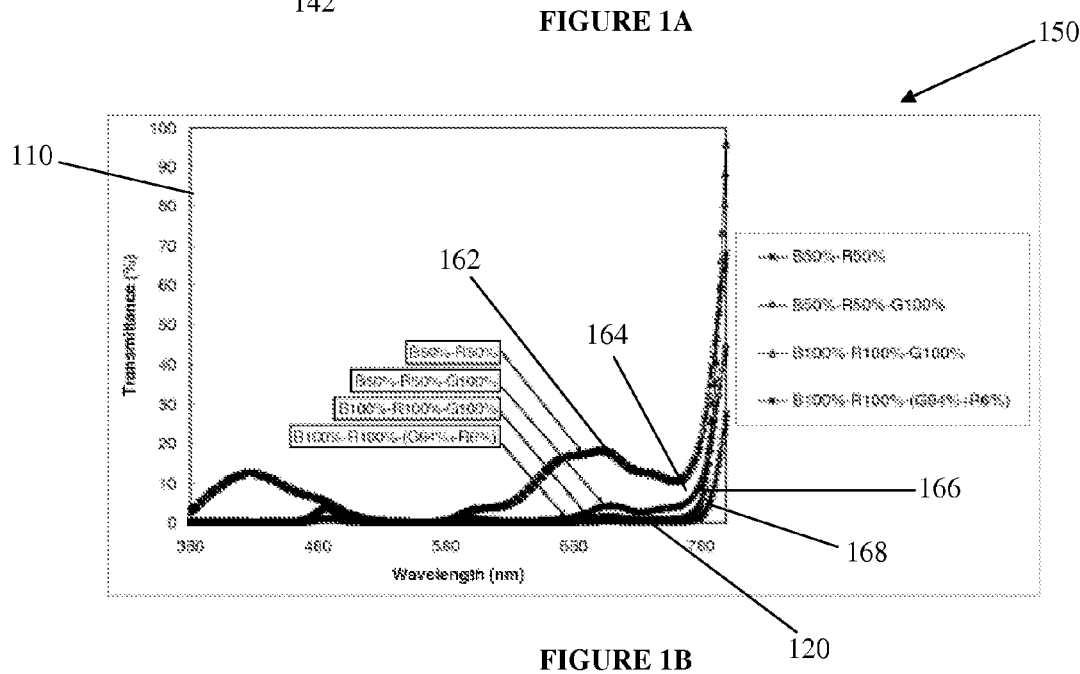
FIG. 1B is a graph of transmittance with respect to wavelength for exemplary mixed color filter layers in accordance with an exemplary embodiment.

FIG. 1B is a graph 150 of transmittance with respect to wavelength for exemplary mixed color filter layers in accordance with an exemplary embodiment. FIG. 1B shows the transmittance spectra of color filter films spin coated on a glass substrate from mixtures containing correspondingly red, green and blue filter materials in indicated proportions. Specifically, FIG. 1B shows transmittance spectra of thin film spin coated from a mixture of a red (R), green (G) and blue (B) filter material. X-axis 120 shows wavelength of the emitted light, and extends from 380 nm (nanometers) to approximately 800 nm. Y-axis 110 shows the transmittance percentage, and extends from 0 percent to 100 percent. Curve 162 shows the transmittance with respect to wavelength of a balanced blue and red filter, having 50 percent blue filter material and 50 percent red filter material. Curve 164 shows the transmittance with respect to wavelength of a mixed blue-red-green filter, having two color filter layers, one being 50 percent blue filter material and 50 percent red filter material, and the other being 100 percent green filter material. Curve 166 shows the transmittance with respect to wavelength of a mixed blue-red-green filter, having three color filter layers, one being 100 percent blue filter material, one being 100 percent red filter material, and one being 100 percent green filter material. Curve 168 shows the transmittance with respect to wavelength of a mixed blue-red-green filter, having three color filter layers, one being 100 percent blue filter material, one being 100 percent red filter material, and one being a mixed green-red filter layer having 94 percent green filter material and 4 percent red filter material.

Depending on the proportion between the three individual filter materials, the transmittance spectra can be fine-tuned to block light across entire visible optical band without significantly changing thickness of the layer. In this manner, a mixture of filter materials can function as an opaque material, either for separation between sub-pixels to present light leakage between sub-pixels, or alternatively or additionally to frame the active area of a sub-pixel to prevent or reduce light leakage or to otherwise improve the performance of an OLED, LED, LCD or other light emitting device. An advantage to using an opaque material formed from filter layer materials is that the process may be simplified due to the use of materials that are already being used, and in the use of processes that are already being performed with the same or similar materials. Additionally, using color filter materials improves the resolution of the opaque material using photolithography techniques compared to black materials conventionally used in the art.

FIG. 2A is table 200 of red, green, blue and combined color coordinates for a pure green filter and an exemplary green filter layer in accordance with an exemplary embodiment. The proposed method also discusses how to precisely tune the color coordinates of a color display to the desired values of the D65 point (representing white) of the chromaticity diagram. For example, in many instances a white OLED display can exhibit a large difference between the 1931 CIE-x and 1931 CIE-y values, as shown in the first row, row 220, of FIG. 2A. The second row, row 230, in FIG. 2A shows the effect of the color mixture in closing the gap between the 1931 CIE-x and 1931 CIE-y values.

In FIG. 2A, the 1931 CIE color coordinates for two groups of OLED displays using 1) 100 percent color green filter and 2) a mixture of 94 percent green and six percent red color filter. These two alternative green filter mixtures are placed on the G (Green) sub-pixel within a group of three RGB pixels. In table 200, color filter mixture column 210 heads the column indicating the two different mixtures. Row 220 in column 210 corresponds to a single color green filter (100%) and row 230 corresponds to a mixture of green and red color filter in the proportion 94% and 6% respectively. These color filter mixtures are placed on a G sub-pixel within group of three RGB pixels. Table 200 shows 1931 CIE-x coordinate 240 for RGB x coordinate 250 for both groups of OLED displays, as well as R x coordinate 252, G x coordinate 254, and B x coordinate 256. Also shown in table 200 is 1931 CIE-y coordinate 245 for RGB y coordinate 260 for both groups of OLED displays, as well as R y coordinate 262, G y coordinate 264, and B y coordinate 266. As is apparent from table 200, row 230 corresponding to the mixture of green and red filter material has an improved white balance. FIG. 2A illustrates an improved color saturation for red and blue using a color filter mixture for a green color filter.

The CIE 1931 color space chromaticity coordinates of D65 are x=0.31271, y=0.32902 using the standard observer. In this manner, the chromaticity of the display may be tuned using a mixture of filter materials.

FIG. 2B is table 270 of red, green, blue and combined luminosities for a pure green filter and an exemplary green filter layer in accordance with an exemplary embodiment. Table 270 lists luminance values for the same group of displays as shown in FIG. 2A. In particular, in table 200, color filter mixture column 210 heads the column indicating the two different mixtures, and row 220 in column 210 corresponds to a single color green filter (100%) and row 230 corresponds to a mixture of green and red color filter in the proportion 94% and 6% respectively.

Table 270 shows luminance 280 (as measured in cd/m$^2$, candelas per meter squared) for RGB luminosity 290 for both groups of OLED displays, as well as R luminosity 292, G luminosity 294, and B luminosity 296. In this manner, the luminance of the display may be tuned using a mixture of filter materials. FIG. 2B shows the luminance for two groups of OLED displays using single color green filter and mixture of green and red color filter in indicated proportions placed on G sub-pixel within group of three RGB pixels. One can see that chromaticity and luminance can be tuned by the use of the color mixture.

Figure 3A:
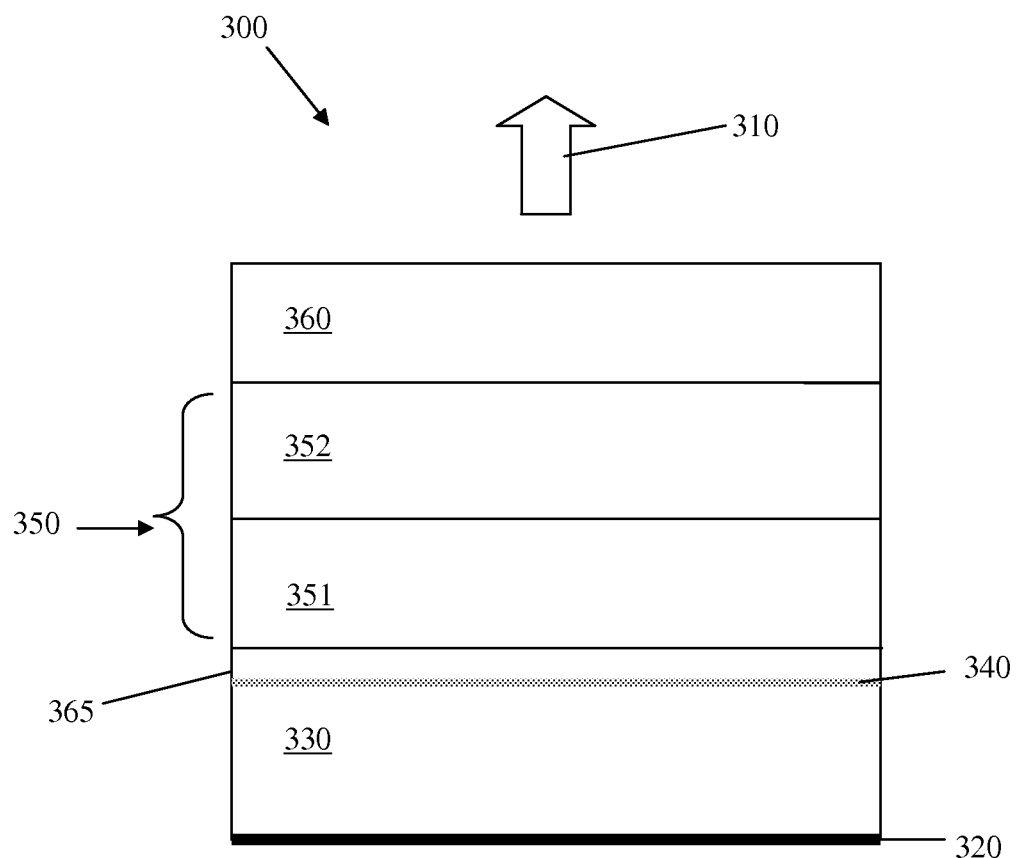
FIG. 3A is a side view of a sub-pixel in accordance with an exemplary embodiment.
Figure 3B:
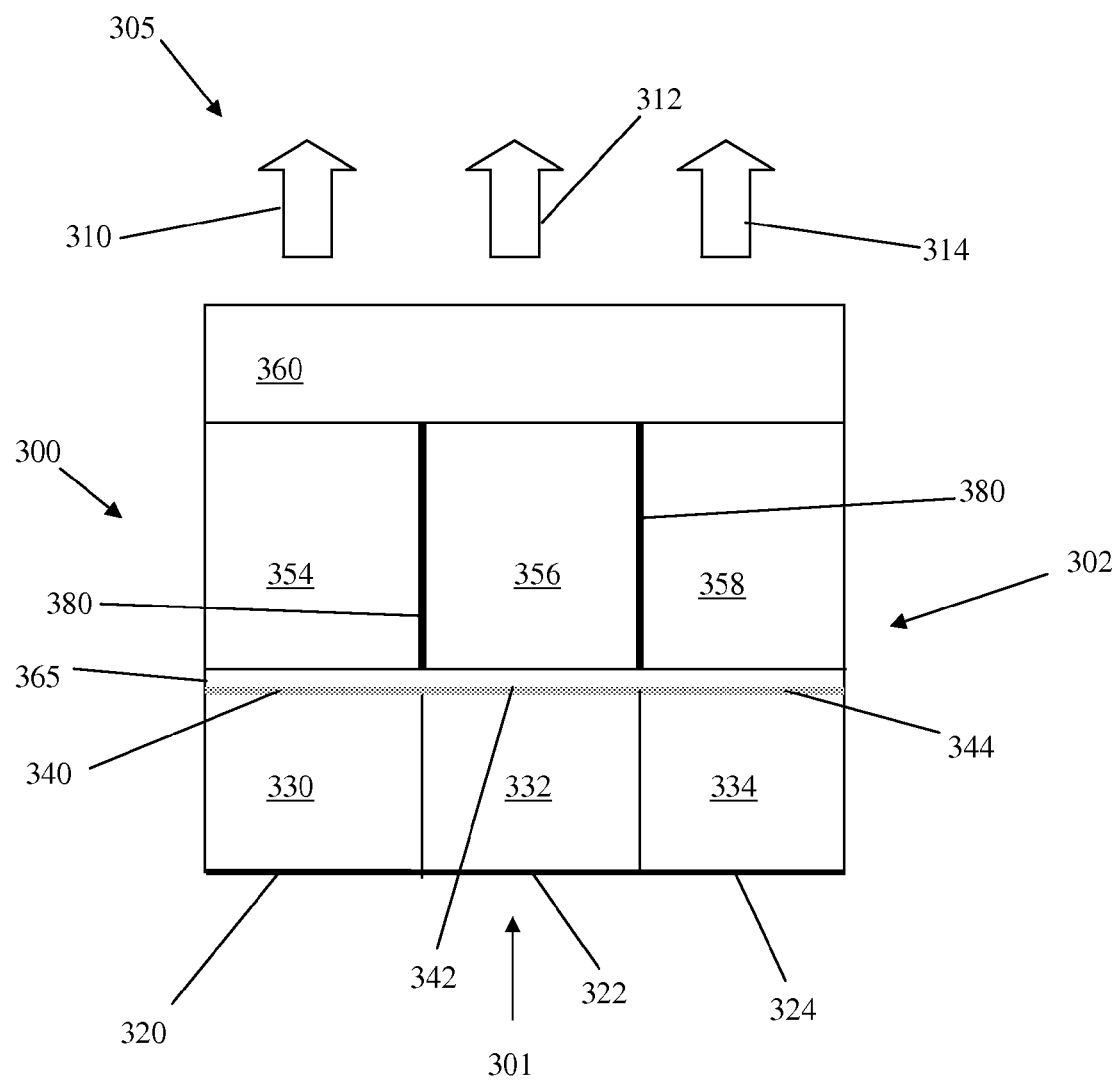
FIG. 3B is a side view of a pixel including three sub-pixels in accordance with another exemplary embodiment.
Figure 3C:
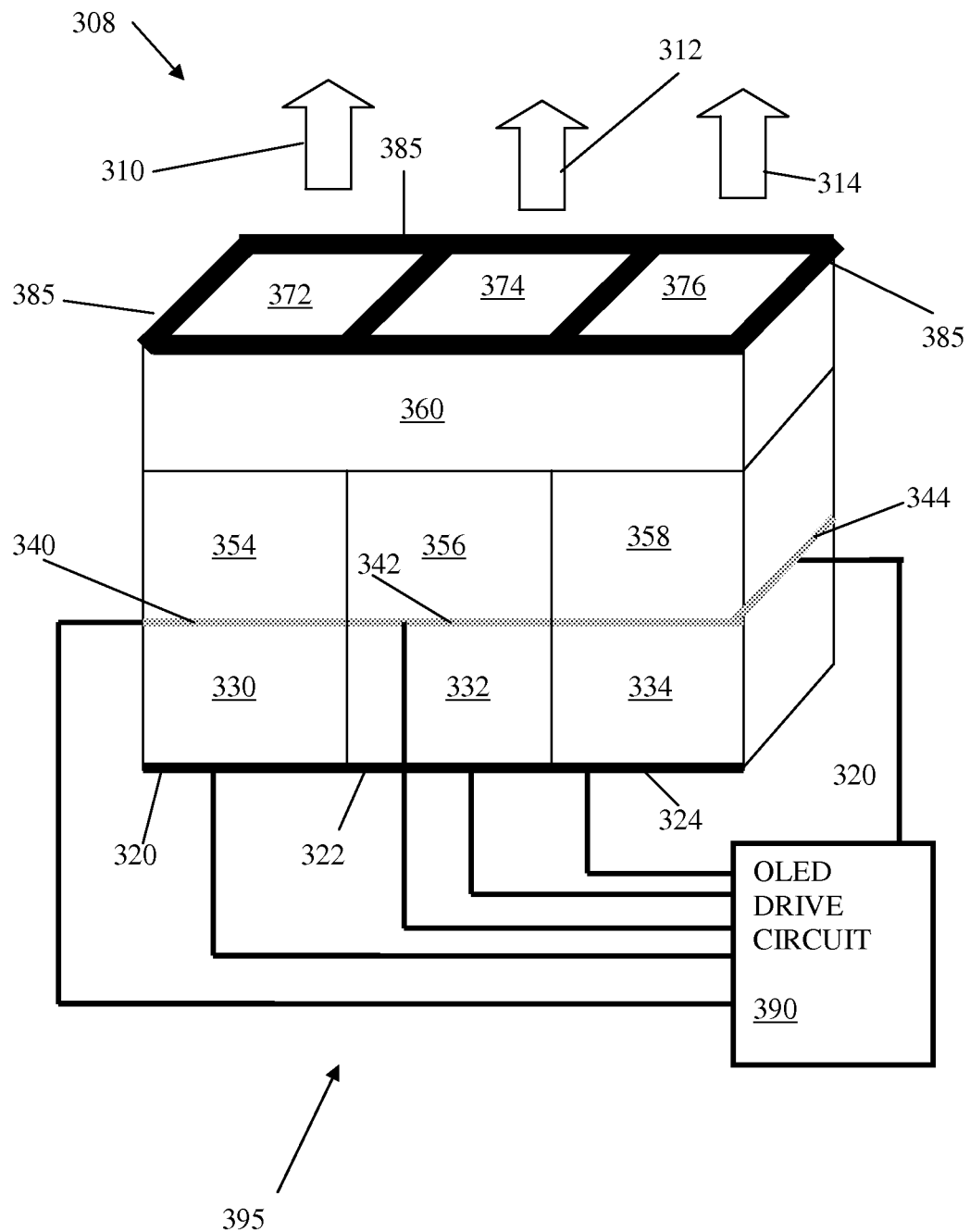
FIG. 3C is a perspective view of a pixel including three sub-pixels in accordance with another exemplary embodiment and including an OLED drive circuit.

FIG. 3A is a side view of sub-pixel 300 in accordance with an exemplary embodiment. Sub-pixel 300 has emissive layer 330 interposed between electrode 320 and transparent electrode 340. Electrode 320 may be an anode or a cathode, and may be transparent, reflective or opaque. Transparent electrode 340 may be an anode or a cathode. Filter layer 350 may include filter sub-layers 351 and 352. Sub-pixel 300 may be a green sub-pixel emitting green light 310, or any other appropriate color. Emissive layer 330 may emit white light, or may emit colored light that requires further filtering. Filter layer 350 may be a mixed green filter, filter sub-layer 351 may be a green filter and filter sub-layer 352 may be a red filter, a blue filter, or any other appropriate color filter for mixing with a green filter. The proportions of filter sub-layer 351 to filter sub-layer 352 may be selected to tune a white balance of a pixel to which sub-pixel 300 belongs, or to reduce the effect of electrical leakage from an adjacent sub-pixel. In other alternatives, as shown in FIGS. 3B and 3C, filter layer 350 may be a mixture of two different color filter materials, and therefore may not need to have sub-layers 351 and 352. Transparent layer 360 may be glass layer, and/or may be scratch protection layer, non-reflective layer, or a capacitive touch-screen layer. Seal layer 365 may be arranged over transparent electrode 340 to prevent contamination, by for instance moisture, of emissive layer 330 or other layers of sub-pixel 300.

FIG. 3B is a side view of pixel 305 including sub-pixels 300, 301, and 302 in accordance with another exemplary embodiment. Sub-pixel 300 has emissive layer 330 interposed between electrode 320 and transparent electrode 340. Electrode 320 may an anode and transparent electrode 340 may be a cathode, or vice versa. Filter layer 354 of sub-pixel 300 may be a green sub-pixel emitting green light 310, or any other appropriate color. Filter layer 354 may be a mixed green filter formed from a mixture of two different color filter materials, and therefore may not have sub-layers. Alternatively, filter layer 354 may have sub-layers of different filter materials to obtain an appropriate color filter mixture with a green filter.

Sub-pixel 301 has emissive layer 332 interposed between electrode 322 and transparent electrode 342. Electrode 322 may an anode and transparent electrode 342 may be a cathode, or vice versa. Filter layer 356 of sub-pixel 301 may be a blue sub-pixel emitting blue light 312, or any other appropriate color. Filter layer 356 may be a mixed blue filter formed from a mixture of two different color filter materials, and therefore may not have sub-layers. Alternatively, filter layer 356 may have sub-layers of different filter materials to obtain an appropriate color filter mixture with a blue filter.

Sub-pixel 302 has emissive layer 334 interposed between electrode 324 and transparent electrode 344. Electrode 324 may an anode and transparent electrode 344 may be a cathode, or vice versa. Filter layer 358 of sub-pixel 302 may be a red sub-pixel emitting red light 314, or any other appropriate color. Filter layer 358 may be a mixed red filter formed from a mixture of two different color filter materials, and therefore may not have sub-layers. Alternatively, filter layer 358 may have sub-layers of different filter materials to obtain an appropriate color filter mixture with a red filter. Opaque separating layers 380 may be interposed between adjacent sub-pixels of sub-pixels 300, 301 and 302.

Opaque separating layers 380 may extend through a filter layer alone to a top edge of a seal layer, may extend through the seal layer, may extend through the transparent electrode, the emissive layer, and/or the base electrode. Opaque separating layers 380 may also extend up through transparent layer 360. Opaque separating layers 380 may function to prevent visible light from one sub-pixel from leaking into an adjacent pixel and thereby causing the emission of light outside a desired spectrum. Opaque separating layers 380 may be composed of a filter material including all three color filter materials in order to obtain an opaque material. Opaque separating layers 380 may be deposited in the same or similar process step as the deposition of filter layers 354, 356, and/or 358.

Transparent layer 360 may be glass layer, and/or may be scratch protection layer, non-reflective layer, or a capacitive touch-screen layer. A relative strength of green light 310, blue light 312, and red light 314 may be determined to make the combination a high quality white balanced light, for instance having a 1931 CIE coordinate close to point D65, by adjusting filter layers 354, 356, and 358 as discussed above.

FIG. 3C is a perspective view of pixel 308 including three sub-pixels in accordance with another exemplary embodiment and including OLED drive circuit 390. A first sub-pixel has emissive layer 330 interposed between electrode 320 and transparent electrode 340. Filter layer 354 of the sub-pixel may be a green sub-pixel emitting green light 310, or any other appropriate color. Filter layer 354 may be a mixed green filter formed from a mixture of two different color filter materials, and therefore may not have sub-layers. Alternatively, filter layer 354 may have sub-layers of different filter materials to obtain an appropriate color filter mixture with a green filter.

The first sub-pixel may have active area 372 on transparent layer 360 out of which light 310 is emitted. Active area 372 may be surrounded, or framed, by frame 385. Frame 385 may be composed of a filter material including all three color filter materials in order to obtain an opaque material. Frame 385 may be positioned above or below transparent layer 360, or alternatively between two different layers that form transparent layer 360.

A second sub-pixel has emissive layer 332 interposed between electrode 322 and transparent electrode 342. Filter layer 356 of the sub-pixel may be a blue sub-pixel emitting blue light 312, or any other appropriate color. Filter layer 356 may be a mixed blue filter formed from a mixture of two different color filter materials, and therefore may not have sub-layers. Alternatively, filter layer 356 may have sub-layers of different filter materials to obtain an appropriate color filter mixture with a blue filter.

The second sub-pixel may have active area 374 on transparent layer 360 out of which light 312 is emitted. Active area 374 may be surrounded, or framed, by frame 385. Frame 385 may be composed of a filter material including all three color filter materials in order to obtain an opaque material. Frame 385 may be positioned above or below transparent layer 360, or alternatively between two different layers that form transparent layer 360.

A third sub-pixel has emissive layer 334 interposed between electrode 324 and transparent electrode 344. Filter layer 358 of sub-pixel 302 may be a red sub-pixel emitting red light 314, or any other appropriate color. Filter layer 358 may be a mixed red filter formed from a mixture of two different color filter materials, and therefore may not have sub-layers. Alternatively, filter layer 358 may have sub-layers of different filter materials to obtain an appropriate color filter mixture with a red filter.

The third sub-pixel may have active area 376 on transparent layer 360 out of which light 314 is emitted. Active area 376 may be bordered also referred to herein as being surrounded or framed) by frame 385. Frame 385 may be composed of a filter material including all three color filter materials in order to obtain an opaque material. Frame 385 may be positioned above or below transparent layer 360, or alternatively between two different layers that form transparent layer 360.

Electrode 320 and transparent electrode 340, electrode 322 and transparent electrode 342, and electrode 324 and transparent electrode 344 may be driven by OLED drive circuit 390 via circuitry 395. Alternatively, OLED drive circuit 390 may be a drive circuit for an LED or any other light emitting device. OLED drive circuit 390 may be controlled by a computer, video controller, or any other appropriate device. OLED drive circuit 390 may drive the different sub-pixels at varying strengths to achieve better color balance and/or better white balancing of green light 310, blue light 312, and red light 314 of pixel 308.

Transparent layer 360 may be glass layer, and/or may be scratch protection layer, non-reflective layer, or a capacitive touch-screen layer. A relative strength of green light 310, blue light 312, and red light 314 may be determined to make the combination a high quality white balanced light, for instance having a 1931 CIE coordinate close to point D65, by adjusting filter layers 354, 356, and 358 as discussed above.

The present invention provides for the use of a mixture of at least two color filter materials deposited as a single layer on at least one RGB sub-pixel to control and fine tune chromaticity and luminance of a display.

The present invention provides for the use of a mixture of at least two color filter materials deposited as a single layer on at least one sub-pixel within a group of three RGB sub-pixels to subdue parasitic contribution of emission due to electrical current leakage from an inactive sub-pixel of a display.

The present invention provides for the use of a mixture of at least two color filter materials to produce single layer opaque film which is deposited around active area of sub-pixel (as a picture frame) or deposited between at least two RGB sub-pixels to block undesired light from contributing to total emission spectrum of a display.

The mixture of at least two color filter materials can be used in combination with other layers of color filter material. The display can be of both active and passive matrix with any dimension of sub-pixels. The display can have any type of a back plane including but not limited to silicon or polysilicon wafer, glass backplane coated with conducting film or films, flexible organic and inorganic backplane or a backplane using combination of both. The display can be OLED, LCD, or any other emissive or non-emissive. The active or passive matrix OLED color display can be emitting from either positive current electrode side or negative current electrode side or both sides simultaneously. The active or passive matrix OLED color display can utilize any type of organic material inside its organic stack including but not limited to small molecule OLED materials, polymer OLED materials, carbon nanotube materials, quantum dot type materials and other materials used to produce light in visible optical band by passing electrical current through the stack. The active or passive OLED color display can utilize any organic or inorganic stack configuration including but not limited to single unit OLED devices, multiunit tandem type OLED devices, stacked OLED devices, with any sequence of the transport and light emitting layers. The active or passive OLED color display can emit light in any color in the visible optical band including but not limited to white, red, green, blue, and yellow.

The invention can be implemented in any type of active or passive matrix OLED color display independently of any other OLED layers lying beneath the color filter layer.

Figure 4:
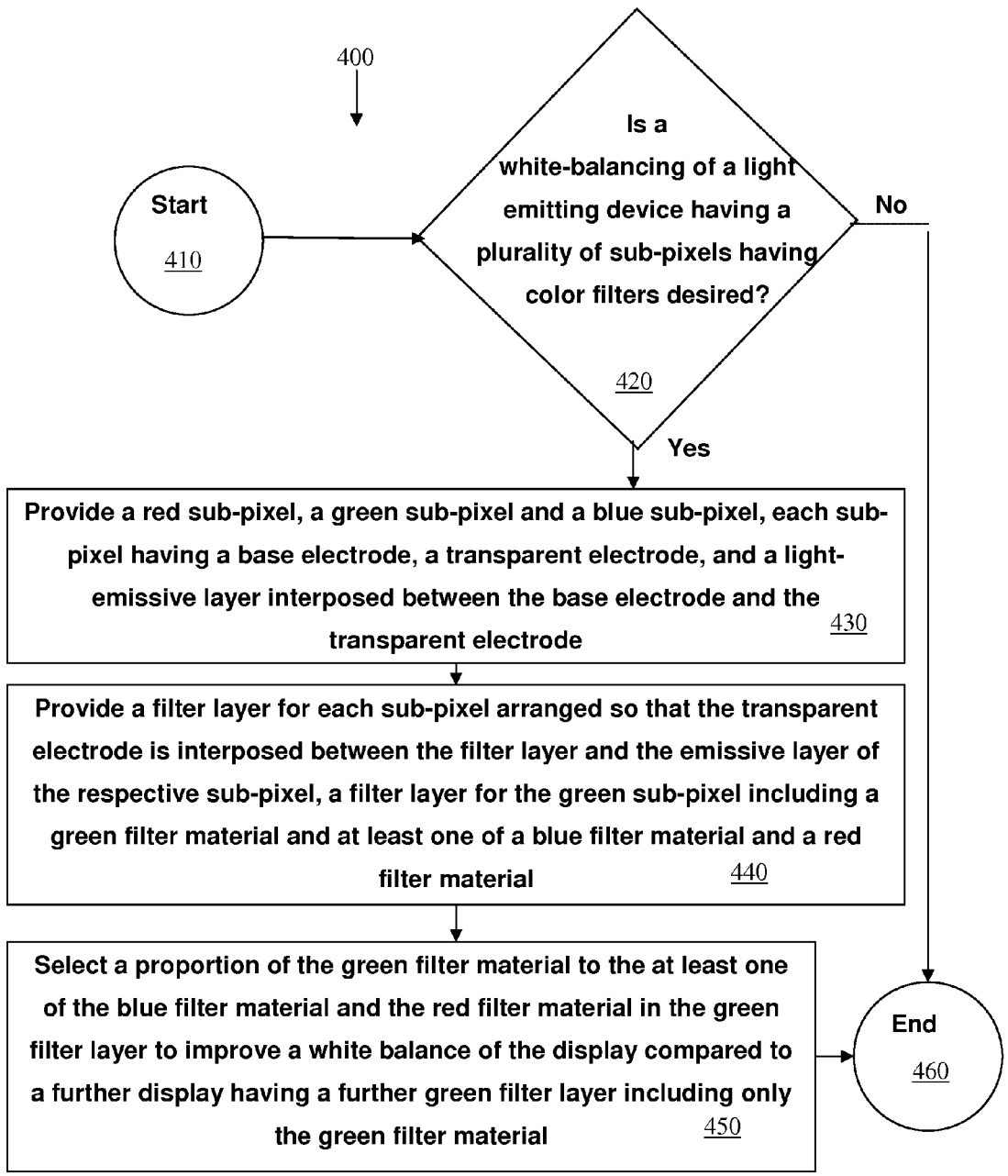
FIG. 4 illustrates a method according to an exemplary embodiment.

FIG. 4 illustrates method 400 according to an exemplary embodiment. Method 400 starts at start circle 410 and proceeds to decision 420, which asks whether a white-balancing of a light emitting device having a plurality of sub-pixels having color filters is desired. If the answer to decision 420 is affirmative, the flow in method 400 proceeds to operation 430, which indicates to provide a red sub-pixel, a green sub-pixel and a blue sub-pixel, each sub-pixel having a base electrode, a transparent electrode, and a light-emissive layer interposed between the base electrode and the transparent electrode. From operation 430, the flow in method 400 proceeds to operation 440, which indicates to provide a filter layer for each sub-pixel arranged so that the transparent electrode is interposed between the filter layer and the emissive layer of the respective sub-pixel, a filter layer for the green sub-pixel including a green filter material and at least one of a blue filter material and a red filter material. From operation 440, the flow in method 400 proceeds to operation 450, which indicates to select a proportion of the green filter material to the at least one of the blue filter material and the red filter material in the green filter layer to improve a white balance of the display compared to a further display having a further green filter layer including only the green filter material. From operation 450, the flow in method 400 proceeds to end circle 460. If the answer to decision 420 is negative, the flow in method 400 proceeds to end circle 460.

Figure 5:
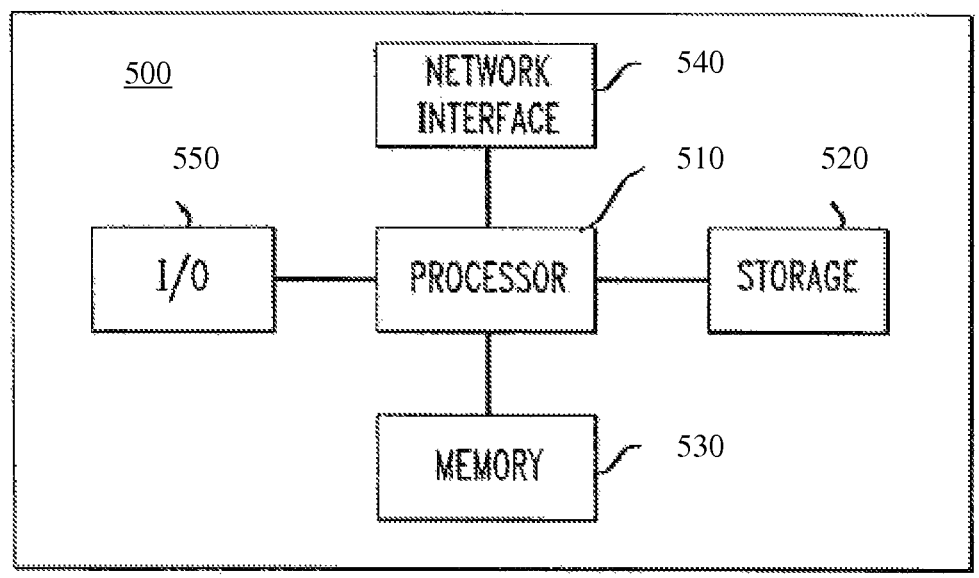
FIG. 5 illustrates a computer system according to an exemplary embodiment.

FIG. 5 illustrates a computer system according to an exemplary embodiment. Computer 500 can, for example, operate OLED driver circuit 390. Additionally, computer 500 can perform the steps described above (e.g., with respect to FIG. 4). Computer 500 contains processor 510 which controls the operation of computer 500 by executing computer program instructions which define such operation, and which may be stored on a computer-readable recording medium. The computer program instructions may be stored in storage 520 (e.g., a magnetic disk, a database) and loaded into memory 530 when execution of the computer program instructions is desired. Thus, the computer operation will be defined by computer program instructions stored in memory 530 and/or storage 520 and computer 500 will be controlled by processor 510 executing the computer program instructions. Computer 500 also includes one or more network interfaces 540 for communicating with other devices, for example other computers, servers, or websites. Network interface 540 may, for example, be a local network, a wireless network, an intranet, or the Internet. Computer 500 also includes input/output 550, which represents devices which allow for user interaction with the computer 500 (e.g., display, keyboard, mouse, speakers, buttons, webcams, etc.). One skilled in the art will recognize that an implementation of an actual computer will contain other components as well, and that FIG. 5 is a high level representation of some of the components of such a computer for illustrative purposes.

While only a limited number of preferred embodiments of the present invention have been disclosed for purposes of illustration, it is obvious that many modifications and variations could be made thereto. It is intended to cover all of those modifications and variations which fall within the scope of the present invention, as defined by the following claims.

We claim:

1. A method of white-balancing a light emitting device having a plurality of sub-pixels having color filters, comprising;
   providing a red sub-pixel, a green sub-pixel and a blue sub-pixel, each sub-pixel having a base electrode, a transparent electrode, and a light-emissive layer interposed between the base electrode and the transparent electrode;
   pre-mixing a green filter material and at least one of a blue filter material and a red filter material wherein the proportion of the green filter material in the pre-mixture to the at least one of the blue filter material and the red filter material in the green filter layer to improve a white balance of the display compared to a display having a further green filter layer including only the green filter material; and
   providing a filter layer for each sub-pixel arranged so that the transparent electrode is interposed between the filter layer and the emissive layer of the respective sub-pixel, the filter layer for the green sub-pixel comprising the pre-mixed green filter material and at least one of a blue filter material and a red filter material and being aligned with the transparent electrode of the green sub-pixel.

2. The method of claim 1, wherein the filter layer comprises one of:
   a first color filter sub-layer comprising the first color filter material and a second color filter sub-layer comprising the second color filter material, the first and second color filter sub-layers being aligned with the transparent electrode and
   a mixture of the first color filter material and the second color filter material.

3. A method of reducing unwanted light output due to electrical leakage in a light emitting device having a plurality of sub-pixels having color filters, comprising:
   providing a color filter for at least one of the sub-pixels by pre-mixing at least first and second color filter materials, the first color filter material adapted to reduce transmittance of visible light outside a first transmittance spectrum corresponding to first color, and the second color filter material adapted to reduce transmittance of visible light outside a second transmittance spectrum corresponding to a second color, the second color being different than the first color, the color filter having a transmittance causing a luminosity due to electrical leakage into the at least one sub pixel to fall below a pre-determined threshold.

4. The method of claim 3, wherein the pre-determined threshold is determined based on an average human perception.

5. A method of reducing unwanted light output due to optical cross-talk in a light emitting device having at least two sub-pixels having color filters, comprising:
   pre-mixing rate at least two of a red filter material, a green filter material, and a blue filter material; and
   providing an opaque layer interposed between two of the sub-pixels, the opaque layer comprising the pre-mixture of the at least two of a red filter material, a green filter material, and a blue filter material.

6. The method of claim 5, wherein the opaque layer is a mixture of red filter material, a green filter material, and a blue filter material.

7. A method of reducing unwanted light output due to optical cross-talk in a light emitting device having at least two sub-pixels having color filters, comprising:
   providing an opaque layer interposed between two of the sub-pixels, the opaque layer being a combination of at least two of a red filter material, a green filter material, and a blue filter material,
   providing a filter layer for each sub-pixel arranged so that the transparent electrode is interposed between the filter layer and the emissive layer of the respective sub-pixel; and
   providing a seal layer covering the two sub-pixels interposed between the filter layer and the transparent electrode of the respective sub-pixels;
   wherein the opaque layer extends from a top edge of the seal layer opposite the transparent electrodes to a point substantially even with a top edge of the filter layers opposite the seal layer.

8. A method of reducing unwanted light output due to spurious reflection from a region surrounding a selectively illuminated active area of a light emitting device having at least one sub-pixel having a color filter, the sub-pixel having a base electrode, a transparent electrode, and an emissive layer interposed between the base electrode and the transparent electrode, comprising:
   pre-mixing at least two of a red filter material, a green filter material and a blue filter material;
   selectively illuminating the active area of the light emitting device; and
   providing, an opaque layer arranged so that the transparent electrode is interposed between the opaque layer and the emissive layer, the opaque layer provided in at least part of the surrounding region surrounding the selectively illuminated active area, the opaque layer comprising the pre-mixture of at least two of a red filter material, a green filter material, and a blue filter material.

9. The method of claim 8, wherein the opaque layer is a mixture of red filter material, a green filter material, and blue filter material.

10. A method white-balancing a light emitting device having a plurality of sub-pixels having color filters comprising:
    providing a sub-pixel having a base electrode, a transparent electrode, and a light-emissive layer interposed between the base electrode and the transparent electrode;
    pre-mixing filter material of a first color and filter material of at least one second color to form a mixed filter material wherein the proportion of the filter material of the first color to the filter material of the at least one second color in the pre-mixed filter material is selected to improve the white balance of the display compared to a display having a filter layer including only the first color filter material; and
    providing a filter layer comprised of the pre-mixed filter material for the sub-pixel arranged so that the transparent electrode is interposed between the filter layer and the emissive layer of the sub-pixel.

11. The method of claim 10 further comprising the steps of providing a filter layer further comprises forming a first filter sub-layer of the filter material of the first color and forming a second filter layer of a second color material and aligning the first filter sub-layer and the second filter sub-layer with the transparent electrode.

* * * * *